United States Patent [19]

Quackenbush

[11] Patent Number: 4,528,514
[45] Date of Patent: Jul. 9, 1985

[54] TRANSCONDUCTANCE AMPLIFIER OPERABLE WITH BIPOLAR INPUT

[75] Inventor: James E. Quackenbush, Canoga Park, Calif.

[73] Assignee: Computer Memories, Incorporated, Chatsworth, Calif.

[21] Appl. No.: 555,374

[22] Filed: Nov. 28, 1983

[51] Int. Cl.³ .......................... H03F 3/26; G05F 1/00
[52] U.S. Cl. .................................... 330/146; 318/679; 330/297; 330/311; 330/263
[58] Field of Search .................. 330/73, 146, 259, 263, 330/271, 275, 297, 301, 311; 318/678, 679, 681

[56] References Cited

U.S. PATENT DOCUMENTS 4,066,945  1/1978  Korte, Jr. ............................ 318/681
4,146,801  3/1979  Vali et al. ......................... 330/146 X Primary Examiner—James B. Mullins
Assistant Examiner—Steven J. Mottola
Attorney, Agent, or Firm—Spensley Horn Jubas & Lubitz

[57] ABSTRACT

An amplifier for bidirectionally driving a motor includes circuitry for enabling the amplifier to operate with a bipolar input signal while employing a single power supply. The amplifier includes an input section which receives the bipolar input signal and provides a unipolar output voltage. The operational amplifier drives a bridge drive network to provide a drive current to output bridge transistor in one of two directions. The bridge network includes control circuitry for causing all of the transistors of the drive bridge to be operated in their active regions, thereby improving the power dissipation characteristics of the network. The output bridge transistors are also controlled to operate in their active regions. In addition, circuitry is included for providing negative feedback for the amplifier despite the fact that the output current is always a positive current.

12 Claims, 1 Drawing Figure

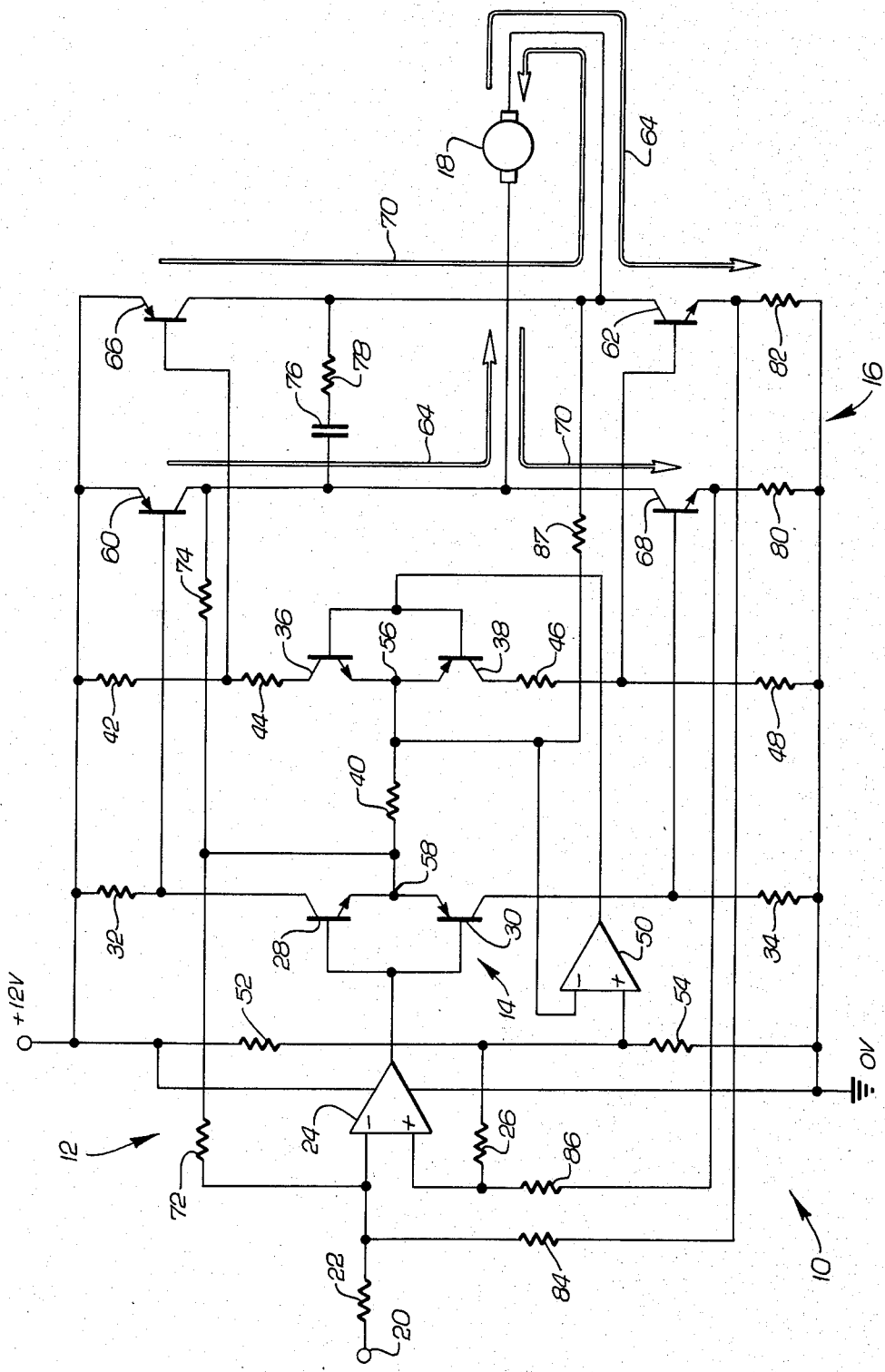

TRANSCONDUCTANCE AMPLIFIER OPERABLE WITH BIPOLAR INPUT

BACKGROUND OF THE INVENTION

1. Field of the Invention

The present invention relates to amplifiers and more particularly to transconductance amplifiers, i.e., amplifiers which provide a current output in response to a voltage input. Still more particularly, the present invention relates to an amplifier for driving a head positioner motor to position the magnetic head of a disk drive system with respect to concentric data tracks on a disk.

2. Description of the Prior Art

Disk drive systems are widely employed for memory storage in computer systems. Often, the disk drive system is manufactured by a separate manufacturer and supplied as a plug in device to the computer manufacturer. The disk drive includes a motor for positioning the magnetic heads of the system with respect to data tracks on the disks. The amplifier for driving the motor is typically supplied by a voltage supply which is a part of the main computer system rather than the disk drive system. In order to reduce the cost to the computer manufacturer, it is desirable to provide an amplifier which operates with a single power supply. However, the amplifier must be able to provide current in two directions, since the motor drives the heads bidirectionally. The amplifiers employed in such systems therefore typically include a bridge network for providing two current output paths from a single supply voltage.

Transconductance amplifiers are desirable in servo designs for various reasons. Transconductance amplifiers are generally more stable than voltage amplifiers, provide better drive characteristics, and have fewer performance variables associated with them. However, transconductance amplifiers typically are not as rugged as some other types of amplifiers.

Bridge networks typically include four transistor devices interconnected in an H configuration, with one transistor being located in each leg of the H, and the transistors being interconnected by the bridge between the legs. Typically, the upper transistors serve as switches and the lower transistors are operated in the active mode to control the amount of current provided by the bridge. Since the upper transistors are operated at as switches, they do not dissipate any power, and the entire power dissipation must be provided by the lower transistors. This increases the cost of the bridge network.

In controlling a bridge network, current flows from a power supply through one of the upper transistors, across the bridge connection, and through the lower transistor. A problem encountered in various bridge networks is that of "feedthrough", in which both the upper and lower transistors on the same side of the H pattern conduct, with the result being that the bridge fails to provide the desired current.

In addition to the power dissipation and feedthrough problems associated with prior art bridge designs, the switching action of the transistors can generate radio frequency interference (RFI) which can interfere with the operation of the magnetic heads of the disk drive.

SUMMARY OF THE INVENTION

The present invention is directed to a bridge amplifier which provides many desirable characteristics when used in disk drive and similar applications. The amplifier is a transconductance amplifier which requires a single power supply, yet is operable with a bipolar input. This is achieved by employing a unique input section to the amplifier which is connected to a single supply voltage and provides a unipolar output voltage in response to a bipolar input voltage. The input section drives a unique bridge drive network in which all of the transistors are operated in their active region, so as to distribute power dissipation among the transistors.

The output of the input section is connected to drive one side (two transistors) of the bridge drive network, and provides a predetermined drive voltage corresponding to a zero input voltage. The drive voltage will be higher or lower than the predetermined voltage when the input signal is positive or negative. A resistor is located in the bridge connected to the emitters of each of the transistors. The voltage at the side of the resistor remote from the transistors driven by the input section is maintained at the predetermined voltage, with the result being that no current will flow through the bridge when the output of the input means is equal to the predetermined voltage, i.e., with a zero input voltage. When the drive voltage to the transistors rises above or falls below the predetermined voltage, one of the transistors will conduct, with the result being that current will flow through two transistors and the resistor of the bridge network. The magnitude of the drive voltage with respect to the predetermined voltage determines which of the transistors will conduct. The output current of the bridge drive network is used to drive output bridge transistors, which provide drive current in the desired direction to the head positioning motor. The drive current provided by the output bridge transistors is monitored and employed to provide negative feedback to the input of the amplifier. This negative feedback is provided even though the amplifier output is a positive current in all instances.

BRIEF DESCRIPTION OF THE DRAWINGS

The invention will be described with reference to the accompanying drawing, wherein:

FIG. 1 is a schematic diagram of the amplifier of the present invention.

DESCRIPTION OF THE PREFERRED EMBODIMENT

The following description is of the best presently contemplated mode of carrying out the invention. This description is made for the purpose of illustrating the general principles of the invention and is not to be taken in a limiting sense. The scope of the invention is best determined by reference to the appended claims.

Referring to FIG. 1, the amplifier 10 of the present invention is generally comprised of an input section 12, a bridge drive network 14 and an output bridge section 16. The amplifier is employed to drive a motor 18 which, in the present embodiment of the invention, is bidirectionally driven to position a magnetic head with respect to the data tracks in a disk drive system. An external 12 volt supply provides the required single supply voltage for the amplifier.

A bipolar input signal which may range between plus or minus 12 volts is applied to an input terminal 20 of the amplifier 10. The input signal is applied to the inverting input of an operational amplifier 24 via an input resistor 22. The operational amplifier 24 has supply inputs connected to the 12 volt supply and ground. The operational amplifier is of a type which is specially designed to operate with a single positive supply voltage in which the input common mode voltage range includes ground. For a zero voltage at the input terminal 20, the output of the amplifier 24 will be maintained at one-half the supply voltage because of the action of a bias resistor 26.

In the present embodiment of the invention, the operational amplifier 24 is a National Semiconductor Model LM358. Other operational amplifiers which employ a single positive supply and allow the input common mode voltage to include ground could also be employed.

The output of the operational amplifier 24 is applied to the bases of two opposite conductivity transistors 28 and 30. The collector of the transistor 28 is coupled to the supply voltage via a supply resistor 32, and the emitter of the transistor 28 is connected to the emitter of the transistor 30. The collector of the transistor 30 is coupled to ground via a resistor 34. The transistors 28 and 30 comprise an input, or buffer, portion of the bridge network. A second pair of transistors 36 and 38 are opposite conductivity types and have their emitters coupled together, and the emitters of all four transistors of the bridge drive network are interconnected by means of a resistor 40. The collector of the transistor 36 is coupled to the supply voltage by means of resistors 42 and 44, while the collector of the transistor 38 is coupled to ground via resistors 46 and 48.

In operation, the bridge drive network will provide current in one of two directions by having either the transistors 28 and 38 or the transistors 30 and 36 conduct. The value of the voltage supplied by the operational amplifier 24 to the transistors 28 and 30 determines which transistor pair will conduct. The desired operation is achieved as a result of the inclusion of a unique control system including the resistor 40 and an operational amplifier 50. The output of the operational amplifier is connected to drive the bases of the transistors 36 and 38. The noninverting input of the operational amplifier 50 is biased to be equal to the predetermined output of the operational amplifier 24 corresponding to a zero input at the input terminal 20, i.e., 6 volts. This is accomplished by means of a voltage dividing network including resistors 52 and 54. The inverting input of the operational amplifier is coupled to the emitters of the transistors 36 and 38. The operational amplifier 50 will therefore drive the transistors 36 and 38 until the voltage at the point 56 between the emitters, and thus at the inverting input of the operational amplifier 50, is equal to the voltage at the noninverting input. The operational amplifier thus serves to maintain the voltage at the point 56 at 6 volts.

For a zero value input signal at the input terminal 20, the output voltage of the operational amplifier 24 will also be 6 volts. The voltage at the point 58 between the emitters of the transistors 28 and 30 will also be at 6 volts at this point, since no current is flowing through the resistor 40. Since the voltage at the output of the operational amplifier 24 is equal to the voltage at point 58, the base to emitter voltage of the transistors 28 and 30 is zero and neither of the transistors will be driven. Thus, no current will flow through the drive bridge.

If a positive input voltage is applied to the terminal 20, the output of the operational amplifier 24 will go below the 6 volt level. This will cause the lower transistor 30 to be turned on. Since the transistor 36 is driven to maintain the point 56 at 6 volts, the turning on of the transistor 30 will cause the transistor 36 to act as a current source, and current will flow from the supply through the transistor 36, the resistor 40 and the transistor 30. Similarly, if a negative input signal is applied to the terminal 20, the output of the operational amplifier 24 will rise above 6 volts, thus causing the transistor 28 to turn on. The transistor 38 will then operate as a current sink, and current will flow from the voltage supply through the transistor 28, the resistor 40 and the transistor 38. When the transistor 28 is turned on, the transistor 38 will be driven in order to maintain the point 56 at 6 volts. Similarly, when the transistor 30 is turned on, the operational amplifier 50 will drive the transistor 36 in order to maintain the voltage at the point 56 at 6 volts.

By including the resistor 40 and the control loop including the operational amplifier 50, the amplifier will operate such that both transistors of whichever pair of transistors 28, 38 or 30, 36 is turned on will be operated in their active regions. This is to be contrasted with prior art designs in which one of the two transistors in the conducting portion of the bridge network is operated as a switch and is thus saturated. By causing each transistor to be operated in its active region, the present invention facilitates the distribution of power dissipation between the two transistors. The power dissipation characteristics of the transistors can therefore be substantially lower than prior art designs in which the entire power dissipation was handled by a single transistor. Thus smaller transistors can be employed, thereby reducing the cost of the amplifier. In addition, the equalized power dissipation enables the amplifier to withstand a temporary short circuit without burning out, thus rendering the design more rugged than prior art designs.

When the transistors 28 and 38 are conducting, output bridge transistors 60 and 62 will be driven. Current will therefore flow from the voltage supply through the transistor 60, the motor 18 and the transistor 62 to ground, as indicated by arrow 64. When the transistors 30 and 36 are conducting, output bridge transistors 66 and 68 will be driven and current will flow from the power supply through the transistor 66, the motor 18 and the transistor 68 to ground, as indicated by arrow 70. Thus, depending upon the state of conduction of the bridge network 14, positive drive current will be provided by the output bridge transistor to the motor in one of two directions.

Resistors 74 and 87 are connected to the amplifier output and provide a voltage feedback to points 56 and 58, i.e., at the modes of resistor 40. This voltage feedback causes the voltage at each of the output terminals to be maintained such that the excursions of the output terminal voltages are centered around 6 volts so that the output bridge transistors which are conducting have equal voltages across them. Resistors 74 and 87 in conjunction with resistor 40 determine the voltage gain of the output bridge and thereby maintain the consistency of the output characteristics.

As is the case with the bridge drive network, the operation of the bridge output transistors is such that power dissipation will be equally distributed. By including the resistor 40 and the control loop including resistors 74 and 87, the amplifier will operate such that both transistors of whichever pair of transistors 60, 62 or 66, 68 is turned on will be operated in their active regions. This is to be contrasted with prior art designs in which one of the two transistors in the conducting portion of the bridge network is operated as a switch and is thus saturated. By causing each transistor to be operated in its active region, the present invention facilitates the distribution of power dissipation between the two transistors. The power dissipation characteristics of the transistors can therefore be substantially lower than prior art designs in which the entire power dissipation was handled by a single transistor. Thus smaller transistors can be employed, thereby reducing the cost of the amplifier. In addition, the equalized power dissipation enables the amplifier to withstand a temporary short circuit without burning out, thus rendering the design more rugged than prior art design.

Resistor 72 provides feedback to determine the gain of the operational amplifier 24 and to remove a dead zone from the output of the system. A capacitor 76 and resistor 78 provide a high frequency rolloff for the output section. In addition, a pair of current sensing resistors 80 and 82 are connected to the emitters of the transistors 68 and 62, respectively, and serve to sample the drive current through the motor 18. When current is passing through the current path 64, current will flow through the resistor 82. The voltage across the resistor 82 is fed back to the inverting input of the operational amplifier 24 via a resistor 84. Since current will flow through the path 64 when the input voltage supplied to the terminal 20 is negative, the application of a positive voltage to the negative terminal of the operational amplifier 24 will result in the desired negative feedback, i.e., feedback which counters the effect of the input signal. The current through the resistor 80 is sampled and fed back to the noninverting input of the operational amplifier 24 via a resistor 86. Since the current path 70 corresponds to a positive input signal, the application of a positive voltage to the other input of the operational amplifier 24 than that to which the input signal as applied will also result in the desired negative feedback. Thus, negative feedback will be automatically applied to the input of the amplifier even though the output of the amplifier is always a positive current.

In summary, the present invention is directed to a unique amplifier in which bidirectional drive current is provided in response to a bipolar input signal with a single power supply. The amplifier incorporates an extremely rugged bridge network in which power dissipation among the transistors is equalized, resulting in substantial performance improvements. In addition, the system is configured to provide automatic negative feedback despite the fact that the output current is always positive.

What is claimed is:

1. A transconductance amplifier which is supplied by a single power supply, comprising:
   input means for receiving a bipolar input voltage and providing a unipolar output voltage, said input means being supplied by a single supply voltage;
   a bridge drive network, driven by the output of the input means, said bridge drive network being supplied by the single supply voltage and having (a) first and second pairs of complementary transistors, the first pair being driven by the output of input means and having a current input terminal of one connected to a current output terminal of the other at a first connection point, the second pair having a current input terminal of one connected to a current output terminal of another at a second point, (b) a resistor having its terminals connected between the first and second points and (c) means for driving the second complementary pair to maintain the voltage of the second point at a predetermined voltage, wherein a first output current path includes a transistor of the first pair, the resistor and a transistor of the second pair and a second output current path includes the other transistor of the first pair, the resistor and the other transistor of the second pair, wherein when the output voltage of the input means is greater than the predetermined voltage a first bridge current will flow through the first current path and when the output voltage of the input means is less than the predetermined voltage a second bridge current will flow through the second current path; and
   output bridge means driven by the first and second bridge currents and providing first and second output currents, respectively, in first and second directions.

2. An amplifier according to claim 1 wherein the means for maintaining includes an operational amplifier for driving the second pair of transistors, said operational amplifier having a first input connected to a voltage equal to the predetermined voltage and a second input connected to the second point.

3. An amplifier according to claim 1 wherein the input means comprises an operational amplifier having a first input which receives the input voltage and a second input receiving a reference voltage.

4. An amplifier according to claim 3 including feedback means from the output bridge means to the operational amplifier for providing negative feedback.

5. An amplifier according to claim 4 wherein the output bridge means includes first and second output means providing the first and second output currents, respectively, wherein the feedback means includes first current sensing means for sensing the first output current and a first feedback path from the first current sensing means to the appropriate input of the operational amplifier to provide negative feedback second current sensing means for sensing the second output current and a second feedback path from the second current sensing means to the other input of the operational amplifier.

6. A transconductance amplifier for bidirectionally driving a motor, said amplifier being supplied by a single power supply, comprising:
   input means for receiving a bipolar input signal and providing a unipolar output signal, said output signal having a first value corresponding to a zero input signal;
   a first transistor of first conductivity type driven by the input means and supplied by the power supply;
   a second transistor of second conductivity type driven by the input means and having its supply input connected to the output of the first transistor at a first point;
   a third transistor of first conductivity type supplied by the power supply;
   a fourth transistor of second conductivity type having its supply input connected to the output of the third transistor at a second point;
   resistive means connected between the first and second points;
   control means for driving the third and fourth transistors to maintain the voltage at the second point substantially equal to the first value, whereby when the output signal of the input means is greater than the first value the first transistor will conduct and current will flow from the supply through the first transistor, the resistive means and the fourth transistor and when the output signal of the input means is less than the first value the second transistor will conduct and current will flow from the supply through the third transistor, the resistive means and the second transistor;

first output means, coupled to the first and fourth transistors, for providing drive current to a motor in a first direction when the first and fourth transistors are conductive; and second output means, coupled to the second and third transistors, for providing drive current to the motor in a second direction when the second and third transistors are conductive.

7. An amplifier according to claim 6 wherein the control means comprises means for comparing the voltage at the second point with a voltage equal to the first value and varying the drive to third and fourth transistors to vary the voltage at the second point.

8. An amplifier according to claim 7 wherein the control means comprises an operational amplifier having a first input connected to a constant voltage equal to the first voltage and a second input connected to the second point.

9. An amplifier according to claim 6 including feedback means, connected between the first output means and the input means and connected between the second output means and the input means, for providing negative feedback for the amplifier regardless of the direction of drive current to the motor.

10. An amplifier according to claim 9 wherein the input means comprises an operational amplifier having an input signal coupled to a first terminal thereof, wherein the feedback means includes a first connection from the first output means to one input of the operational amplifier and a second connection from the second output means to the other input of the operational amplifier.

11. An amplifier according to claim 10 wherein the feedback means includes first current sensing means for sensing the magnitude of the drive current from the first output means and second current sensing means for sensing the magnitude of the drive current from the second output means, wherein the first and second connections are from the first and second current sensing means to the operational amplifier.

12. A transconductance amplifier supplied by a single power supply, comprising:

input means for receiving a bipolar input voltage and providing a unipolar output voltage, wherein when the input voltage is zero the output voltage is a predetermined voltage;

a drive network including (a) first and second complementary transistors, each driven by the output of the input circuit, wherein an output terminal of the first transistor is connected at a first point to a supply input terminal of the second transistor, (b) third and fourth complementary transistors, wherein an output terminal of the third transistor is connected at a second point to a supply terminal of the fourth transistor, (c) a resistor having a first terminal connected to the first point and a second terminal connected to the second point, and (d) means for driving the third and fourth transistors so as to maintain the voltage at the second point at a level equal to the voltage at the first point in the absence of an input voltage, wherein an input voltage of first polarity will cause the first transistor to conduct thereby allowing current to flow through a first current path including the first transitor, resistor and fourth transistor and an input voltage of second polarity will cause the second transistor to conduct, thereby allowing current to flow through a second current path including the second transistor, resistor and third transistor; and output bridge means having a first portion driven by current through the first current path and a second portion driven by current through the second current path.

* * * * *